United States Patent
Yoo et al.

(10) Patent No.: US 7,129,118 B2
(45) Date of Patent: Oct. 31, 2006

(54) PROTECTIVE TAPE REMOVING APPARATUS AND METHOD OF ASSEMBLING SEMICONDUCTOR PACKAGE USING THE SAME

(75) Inventors: Cheol-Joon Yoo, Cheonan (KR); Ki-Kwon Jeong, Cheonan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/621,576

(22) Filed: Jul. 18, 2003

(65) Prior Publication Data
US 2004/0121514 A1 Jun. 24, 2004

(30) Foreign Application Priority Data
Dec. 23, 2002 (KR) .................. 10-2002-0082672

(51) Int. Cl.
*H01L 21/58* (2006.01)
*B23P 19/00* (2006.01)
(52) U.S. Cl. .................. 438/113; 438/464; 29/740; 29/743; 156/584
(58) Field of Classification Search ............ 438/108, 438/113, 114, 459, 461, 464, 465, 977; 29/740, 29/743; 156/584
See application file for complete search history.

(56) References Cited

U.S. PATENT DOCUMENTS

| | | | | |
|---|---|---|---|---|
| 4,285,433 A | * | 8/1981 | Garrett et al. | 209/573 |
| 5,480,842 A | * | 1/1996 | Clifton et al. | 438/464 |
| 6,202,292 B1 | * | 3/2001 | Farnworth et al. | 29/743 |
| 6,297,131 B1 | * | 10/2001 | Yamada et al. | 438/464 |
| 6,624,048 B1 | * | 9/2003 | Madge | 438/460 |
| 6,650,006 B1 | * | 11/2003 | Huang et al. | 257/686 |
| 2002/0048904 A1 | * | 4/2002 | Oka | 438/464 |
| 2002/0055238 A1 | * | 5/2002 | Sugino et al. | 438/459 |
| 2003/0190795 A1 | * | 10/2003 | Kawakami | 438/462 |

FOREIGN PATENT DOCUMENTS

KR 99-69593 9/1999

* cited by examiner

*Primary Examiner*—Stephen W. Smoot
(74) *Attorney, Agent, or Firm*—Harness, Dickey & Pierce, P.L.C.

(57) ABSTRACT

A method of utilizing a removable protective tape to protect the active surfaces of semiconductor wafer and the individual semiconductor chips during semiconductor packaging processes is provided along with several configurations of apparatuses that may be used in such a method for removing protective tape portions from individual semiconductor chips during the assembly process.

15 Claims, 9 Drawing Sheets

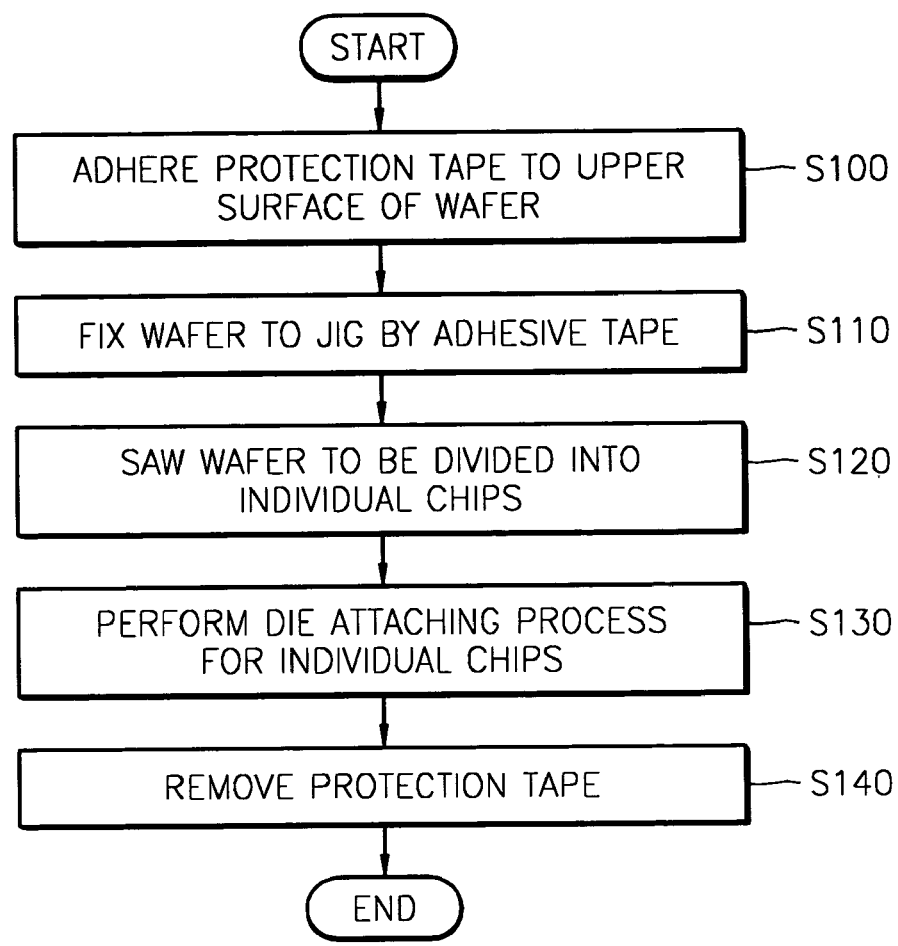
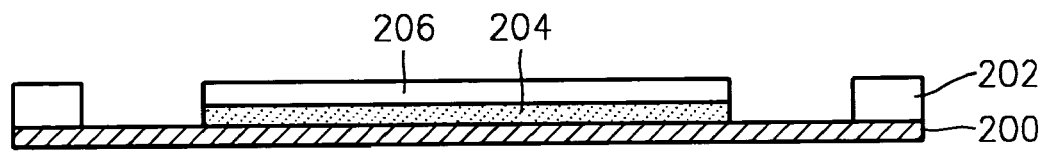

PROTECTIVE TAPE REMOVING APPARATUS AND METHOD OF ASSEMBLING SEMICONDUCTOR PACKAGE USING THE SAME

BACKGROUND OF THE INVENTION

This application claims the priority under 35 U.S.C. § 119 from Korean Patent Application No. 2002-82672, which was filed on Dec. 23, 2002, in the Korean Intellectual Property Office, the disclosure of which is incorporated herein, in its entirety, by reference.

FIELD OF THE INVENTION

The present invention relates to an apparatus and a related method for removing protective tape used in a semiconductor packaging process, a method of assembling a semiconductor package and, more particularly, a method of assembling a semiconductor package in which the die attaching process is completed before removing a protective tape from individual chips and a protective tape removing apparatus that may be used to remove the protective tape from the attached dies during a semiconductor packaging process.

DESCRIPTION OF THE RELATED ART

Generally, the various process steps required for manufacturing semiconductor devices are broadly grouped into the fabrication steps required to form semiconductor chips on a semiconductor wafer, the packaging steps required to separate the individual semiconductor chips and mount the chip or chips in a package and the testing steps required for confirming the functionality of the completed semiconductor package. The packaging steps include steps for sawing the semiconductor wafer to divide the semiconductor elements formed in the wafer into individual chips, attaching the individual chips to die pads provided on a series of leadframes, wire-bonding to form electrical connections between the chip bonding pads and the leadframe inner leads, encapsulating the individual chips with a molding compound, plating the outer leadframe leads with solder and bending, cutting or otherwise forming the plated outer leads into the desired configuration to form discrete packages.

A conventional a method of assembling a semiconductor package is illustrated in the cross-sectional and perspective views provided in FIGS. 1–4. As illustrated in FIG. 1, a protective tape 12 is typically adhered to an upper surface of a wafer 10 to protect a series of semiconductor devices that have been formed. After the protective tape is in place, the wafer is typically subjected to a backside grinding process to reduce the thickness of the semiconductor substrate. The thinned or background wafer 10 is then typically fixed to an assembly such as a jig, chuck or wafer table (not shown) using an adhesive tape 24 attached to, and/or a vacuum applied to, the backside of the wafer. The protective tape 12 is then typically removed from the wafer to once again expose the semiconductor devices that are formed on the upper surface.

The assembly to which the wafer 10 is fixed will then typically be transferred to a wafer sawing station 50 through the action of transfer equipment or other mechanisms (not shown). Depending on the design and arrangement the wafer handling equipment, the wafer 10 may remain on the assembly for the duration of the sawing operation or, as illustrated, may be loaded onto a vacuum plate 22 provided on the main body 20 of the wafer sawing station 50. The adhesive tape 24 provided on and/or the vacuum applied to the backside of the wafer maintains the orientation of the individual chips 10' and prevents them from being detached or shifted during the wafer sawing process.

A blade 28 is disposed above the wafer 10 held on the main body 20 at the wafer sawing station. The blade 28 saws the wafer 10 along scribe lines 26 formed on an upper surface of the wafer 10 to divide the wafer 10 into a series of individual semiconductor chips 10'. The blade 28, typically rotating, is generally moved sequentially along and downwardly through those portions of the wafer below the scribe lines 26 separating the individual chips arrayed on the upper surface of the wafer 10. As illustrated in FIG. 2B, the sawing operation separates wafer 10 into the individual chips 10' that are held in place by adhesive tape 24 and/or vacuum.

After the sawing operation is complete and the wafer 10 has been divided into a series of individual chips 10', the sawed wafer 10 is transferred from the sawing station to a die attaching station (not shown). In some exemplary embodiments utilizing an adhesive tape 24, the adhesive tape may be stretched after the sawing operation has been completed to increase the separation distance between adjacent chips and reduce the likelihood of mechanical interference during the die attaching operation.

At the die attaching station, a chip transfer device such as the pick-up collet 30 will typically move over the surface of wafer 10 to a position above a selected individual chip 10'. The pick-up collet 30 or other chip transfer device will then be lowered or extended to contact the selected individual chip 10' and establish a firm mechanical or vacuum attachment to the selected individual chip.

The pick-up collet 30 or other chip transfer device will then be raised or retracted, thereby detaching the selected individual chip 10' from the adhesive tape 24 or vacuum source (not shown). The pick-up collet 30 or other chip transfer device may then be used to transfer the removed individual chip 10' to a chip pad provided on a leadframe, circuit board or other substrate 40 used for manufacturing semiconductor packages. An epoxy adhesive or adhesive tape may be utilized to attach the chip to the chip pad and additional curing and/or thermal processing may be implemented to complete the die attaching process.

FIG. 5 is a flowchart highlighting certain of the process steps in a conventional method of assembling a semiconductor package as illustrated in FIGS. 1–4. As shown in FIG. 5, the protective tape 12 is adhered to the upper surface of the wafer 10 (step S60) and then the wafer is fixed to the jig using adhesive tape 24 (step S65). The protective tape 12 is then removed from the wafer 10 (step S70) and wafer is sawed into the individual chips 10' (step S75), after which the die attaching process for the individual chips is completed (step S80).

However, during the die attaching process, as the individual chips 10' are detached from the adhesive tape 24 by the pick-up collet 30 there is an increased likelihood that the individual chips 10' will be cracked or otherwise damaged by the forces applied. Particularly in those instances in which the backside grinding process produces a thinner wafer, such as for wafers 10 intended to supply chips 10' for use in low profile packages such as a Thin Quad Flat Package (TQFP) or a Thin Small Outline J-lead (TSOJ), the likelihood of damaging the chip increases as a result of the reduced mechanical strength. Similarly, devices in which the chip area is larger will have a greater likelihood of being damaged than a smaller chip of equal thickness.

SUMMARY OF THE INVENTION

The invention provides exemplary methods for assembling a semiconductor package while reducing the likelihood of damage during the chip separation and chip mounting processes.

The invention also provides an exemplary protective tape removing apparatus that may be used in semiconductor packaging processes for reducing the likelihood of damage during the chip attaching process.

According to an exemplary embodiment of the invention, a method of assembling a semiconductor package comprises adhering a protective tape to an upper surface of a wafer for protecting a circuit area; attaching the wafer to a jig, an adhesive tape for supporting the wafer being adhered to a lower portion of the jig; sawing the wafer to divide the wafer into individual chips; attaching the individual chips to a chip mounting area on, for example, a leadframe, a circuit board or a lower chip in a multi-chip stacked arrangement, for manufacturing the semiconductor package; decreasing the adhesion of the protective tape; and removing the protective tape from the individual chips.

The invention may be utilizing in assembling semiconductor packages in which the thickness of the wafer is 200 μm or less, in which the semiconductor package includes a leadframe providing outer leads for making external connections or a substrate on which solder balls or pins are used for making external connections.

According to exemplary embodiments of the invention, the adhesion of the protective tape to the semiconductor chip may be decreased by applying ultraviolet radiation and/or increasing the temperature of the protective tape above a degradation temperature. Further, the protective tape will typically be transparent so that the pattern of the individual chips can be recognized through the protective tape to allow for alignment of the sawing and die transfer operations and have a thickness of 500 μm or less. It is preferable that the thickness of the protective tape correspond to the thickness of the wafer to which it is applied, with thinner wafers using a thinner the protective tape and thicker wafers using a thicker protective tape.

According to an exemplary method of assembling a semiconductor package according to the invention, the protective tape will be removed from each of the individual chips by pressing a release tape having an adhesive side or area against the upper surface of the protective tape. The contact between the release tape and the protective tape may be achieved by using a pressure pin, pressure roller or other element(s) capable of applying sufficient pressure across a surface of the release tape to form a bond between the release tape and the underlying protective tape portion without damaging the chip.

According to another exemplary embodiment of the invention, a protective tape removing apparatus may comprise a body for loading a frame for manufacturing a semiconductor package to which individual chips, on which a protective tape is adhered, are attached; a release tape, which is located on an upper portion of the frame and attached to an upper surface of the protective tape to remove the protective tape; a mechanism for moving the release tape into contact with the protective tape and applying sufficient pressure to adhere the release tape to the protective tape; a supply roll, which is located on the upper portion of the frame and supplies the release tape; and a winding roll, which is located on the upper portion of the frame for receiving and winding the release tape and the removed protective tape segments.

An exemplary embodiment of the protective tape removing apparatus incorporates a pressure pin, ram or piston for pressing the release tape against the protective tape as it extends or lowers toward the surface of the chip. Another exemplary embodiment of the protective tape removing apparatus incorporates a pressure roller having a pressure or contact surface for pressing the protective tape firmly against the release tape as the pressure roller rolls across the back of the release tape. An exemplary protective tape removing apparatus according to the invention may also include one or more guide rollers or pins for controlling the path and/or maintaining the tension of the release tape between the supply roll and the winding roll and/or control the initial spacing between the release tape and the protective tape.

BRIEF DESCRIPTION OF THE DRAWINGS

The above and other aspects and advantages of the present invention will become more apparent by describing in detail exemplary embodiments thereof with reference to the attached drawings in which:

FIG. 6 is a flowchart for explaining a method of assembling a semiconductor package according to the present invention;

FIGS. 7–10 are cross-sectional views illustrating an exemplary embodiment of a method of assembling a semiconductor package according to the invention;

DETAILED DESCRIPTION OF EXEMPLARY EMBODIMENTS

Figure 1:
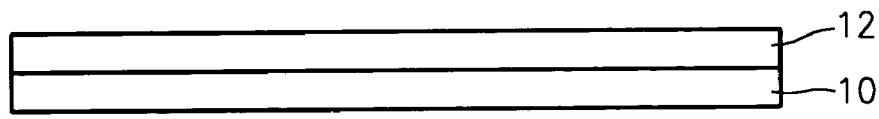
FIGS. 1–4 are a cross-sectional view and perspective views illustrating a conventional method of assembling a semiconductor package.

The invention will now be described more fully with reference to the accompanying drawings, in which certain exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the shapes of elements, spacings, sizings, etc., may be exaggerated for clarity and are not intended to be to scale. When the same reference numeral appears in more than one drawing, it denotes an identical or substantially corresponding element.

For the convenience of explanation, exemplary methods for practicing the invention will be described separately from the exemplary embodiments of mechanisms useful for assembling semiconductor packages that utilize a protective tape removing apparatus.

Method of Assembling Semiconductor Package

FIG. 6 is a flowchart detailing certain process steps in an exemplary method for assembling a semiconductor package according to the invention, with FIGS. 7–10 providing cross-sectional views generally illustrating certain of the sequence of process steps detailed in FIG. 6 for assembling a semiconductor package according to the invention.

As shown in FIGS. 6–10, a sheet or film of protective tape 206 is attached to an upper surface of a wafer 204 in step S100. The wafer 204 is then fixed to a jig 202 by an adhesive tape 200 in step S110. The wafer 204 is then sawed along the scribe lines to separate the wafer into individual chips 204', each of the individual chips being covered by an individual portion of protective tape 206' in step S120. A die attaching process for the individual chips 204' and the corresponding protective tape portions 206' is then performed in step S130. Only after the die attaching process has been completed are the protective tape portions 206' removed from the upper surfaces of the corresponding individual chips 204' in step S140.

Figure 2A:
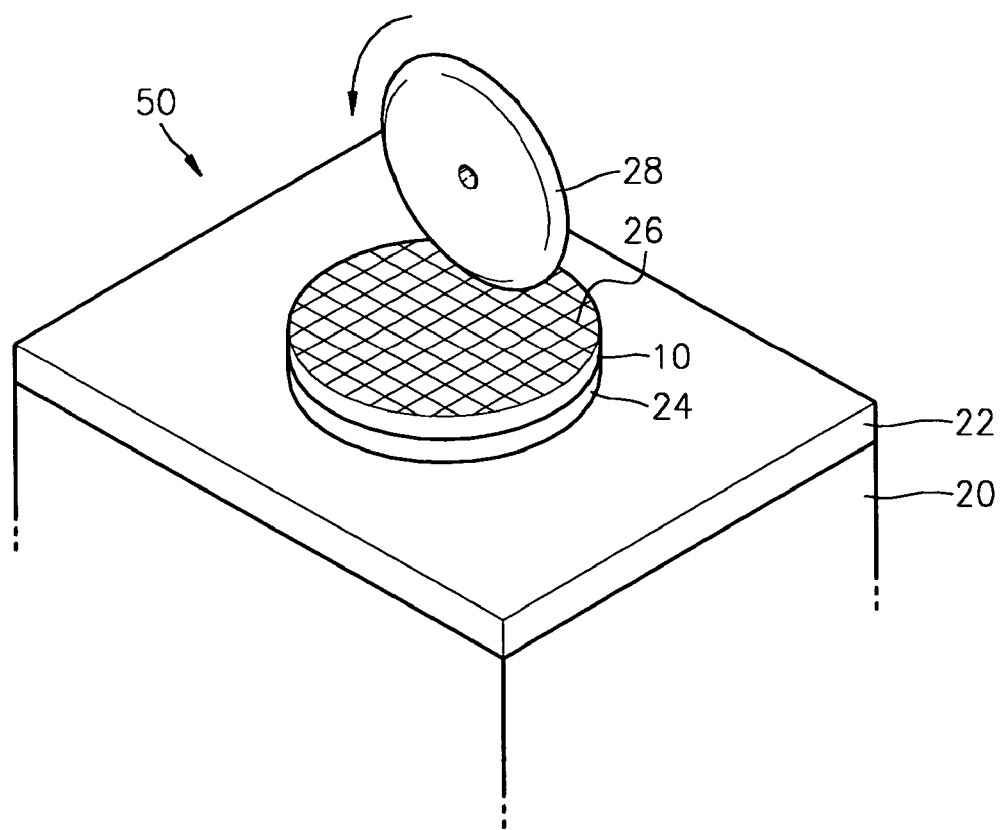
Figure 2B:
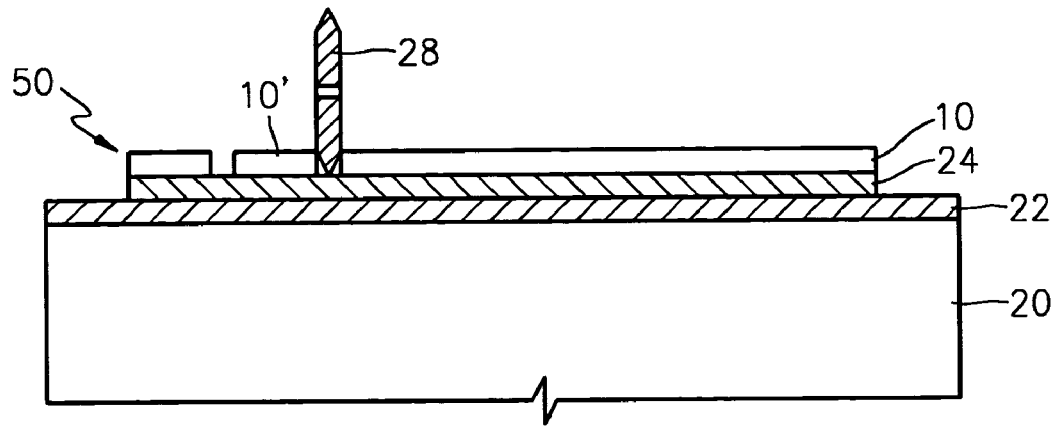

As illustrated in FIGS. 7–10, the protective tape 206 is adhered to the upper surface of the wafer 204 to protect the circuit area of the chips formed on the upper surface of the wafer. A backside grinding process is then performed to thin wafer 204, after which the thinned wafer is fixed to a jig 202 or other wafer carrier assembly by the adhesive tape 200 or by vacuum applied to the backside of the wafer (not shown). The fixed wafer 204 is then transferred to a wafer sawing station (as generally illustrated in FIG. 2) by a transfer mechanism or combination of mechanisms (not shown).

The wafer 204 is then divided into individual chips 204' by sawing along the scribe lines with blade 208. The movement of blade 208 is typically controlled to remove the entire thickness of the wafer 204 below the scribe lines without completely penetrating the adhesive tape 200 or contacting the upper surface of the wafer carrier assembly. This allows the adhesive tape 200 or the applied vacuum to maintain the orientation of the individual chips 204' and prevent them from being detached or misaligned during the wafer sawing process.

The protective tape 206 according to exemplary embodiments of the invention incorporates an adhesive composition containing a component that may be used to adjust the adhesion strength by applying heat or ultraviolet (UV) radiation. This adhesive composition is typically coated on a base film that may include only a single layer or may include multiple layers. In an exemplary embodiment of the invention, the protective tape 206 includes a component that will tend to decrease the adhesive properties of the protective tape when exposed to UV radiation. After being treated with UV radiation, the protective tape 206, and the associate adhesive composition layer, can be removed substantially completely from the surface of chip 204'.

In exemplary embodiments, the protective tape 206 will be sufficiently transparent so that the patterns of the upper surfaces of the individual chips 204' can be easily recognized during the alignment and wafer sawing processes. Further, the thickness of the protective tape 206 may be adjusted to thicknesses of 500 µm or less in order to match the thickness of the protective tape to the thickness of the wafer and the size of the chips in order to reduce the likelihood of damage to the individual chips 204' as they are detached from the adhesive tape 200. For example, if the chip size is relatively small, a thinner protective tape 206 may be used and if the chip size is relatively large, a thicker protective tape 206 may be used.

Figure 3A:
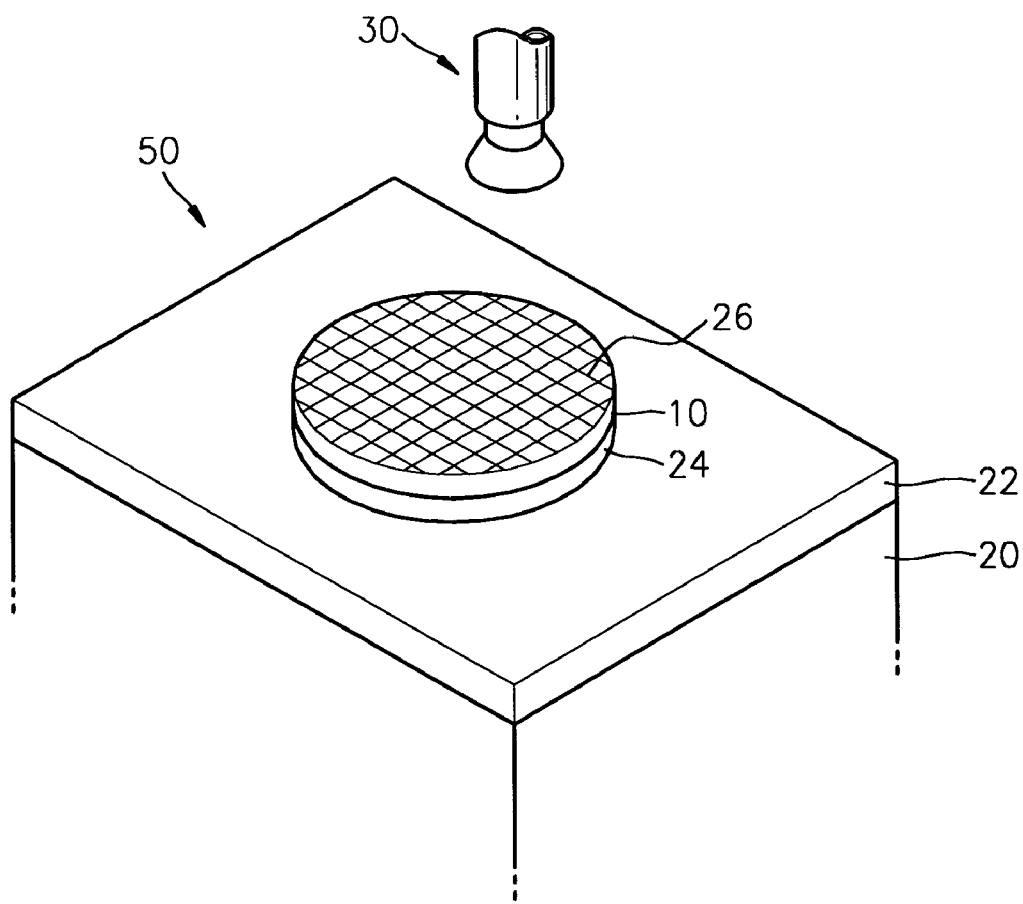
Figure 3B:
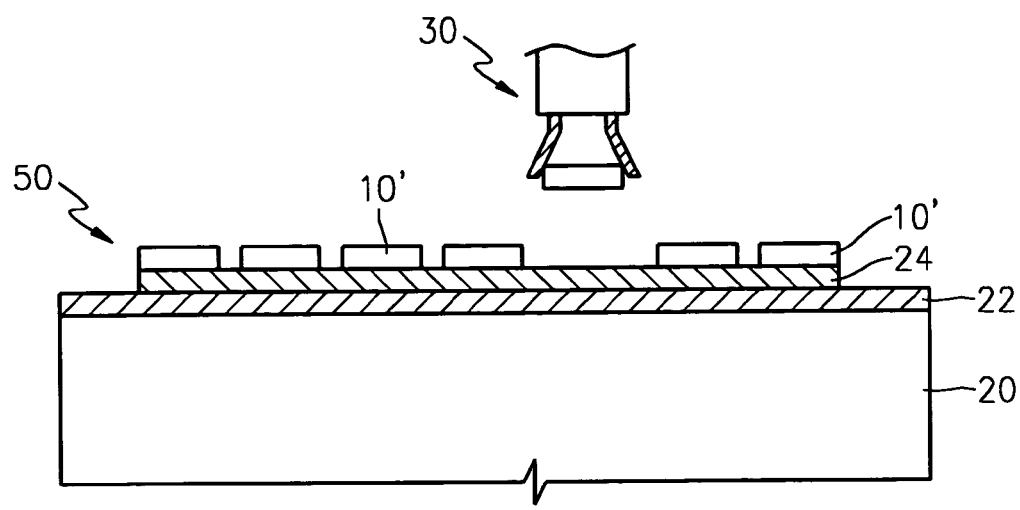
Figure 4:
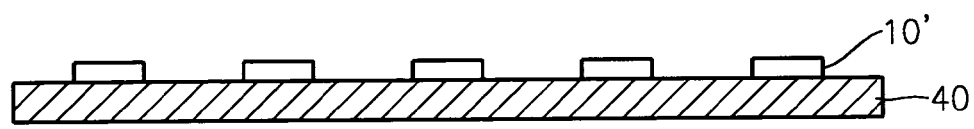
Figure 5:
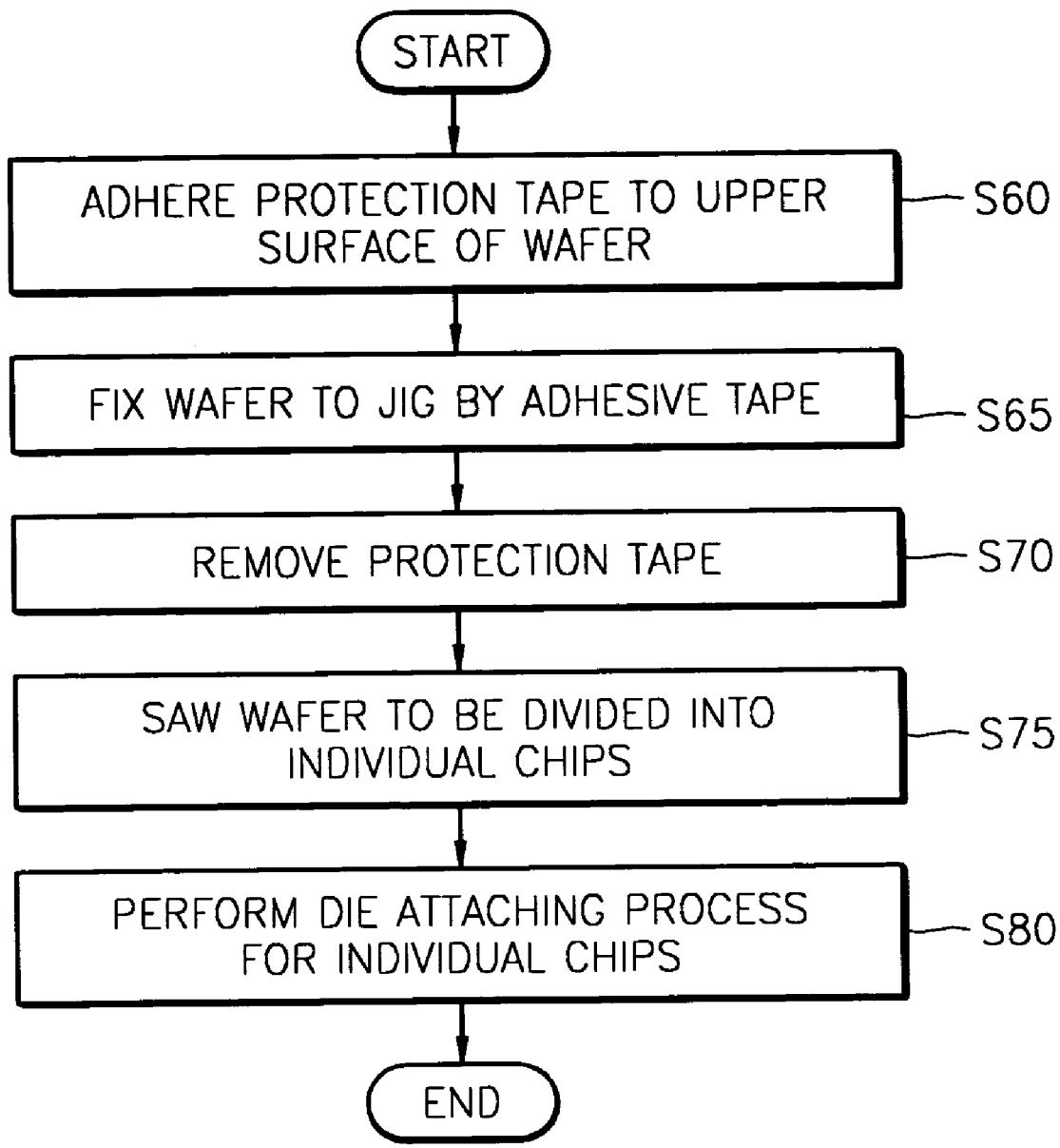
FIG. 5 is a flowchart for explaining a conventional method of assembling a semiconductor package.
Figure 8:
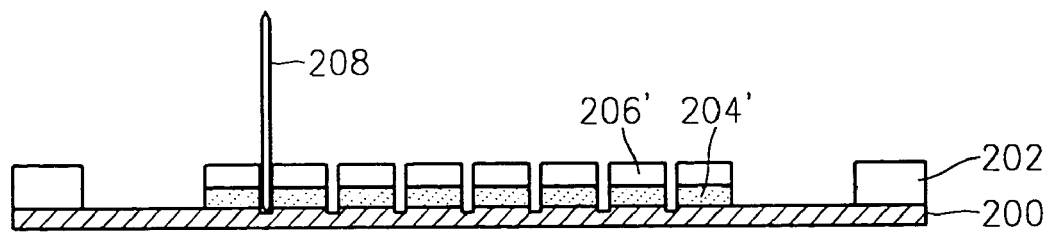
Figure 9:
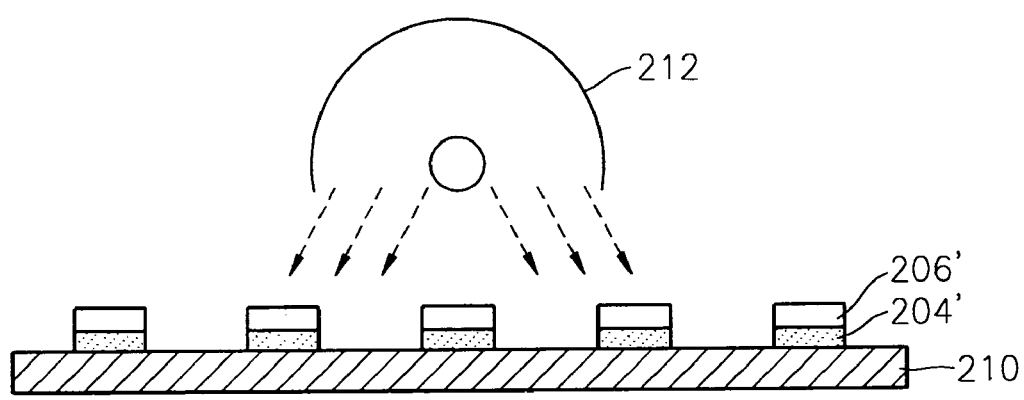
Figure 10:
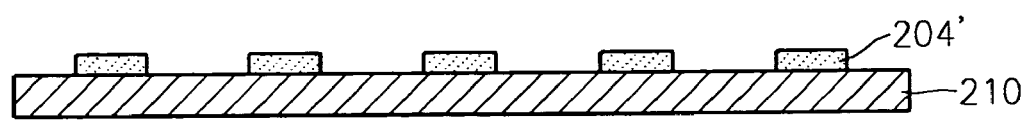

After the wafer 204 has been sawed into the individual chips 204', a pick-up collet or other device (as generally illustrated in FIG. 3A) mounted in a die attaching equipment (not shown) may be positioned above the individual chips 204'. For exemplary embodiments utilizing a backside adhesive tape, the tape may be stretched after the sawing process to increase the spacing between adjacent chips. The pick-up collet may then extend to contact an individual chip 204', establish a firm mechanical and/or vacuum attachment to the individual chip 204', and then retract to detach the individual chip 204' from the adhesive tape 200. The individual chip 204' may then be transferred to a chip pad provided on frame 210 on which an epoxy adhesive or adhesive tape is provided to attach the chip to the chip pad.

If necessary, additional processing may be performed to cure the epoxy adhesive or heat the adhesive tape to complete the die attachment process. The frame 210 used for manufacturing the semiconductor package may comprise a leadframe in which outer leads will be used to establish external connections or a substrate in which solder balls will be used to establish external connections. Although the chip 204' will typically be securely mounted on the chip pads before the protective tape portions 206' are removed, in some instances additional curing or other processing may be performed after the protective tape portions 206' have been removed.

Next, the adhesion between the protective tape portions 206' and the active surfaces of the corresponding individual semiconductor chip 204' is decreased through the application of heat and/or UV radiation. For exemplary embodiments utilizing a UV protective tape, a UV lamp 212 may be used to decrease the adhesion of the protective tape portions 206'. For example, a quantity of UV radiation produced by a mercury lamp may be irradiated onto protective tape portions 206' having a thickness of about 130–150 µm at an energy flux of about 200 mJ/cm$^2$ for about 8 seconds. A photo initiator incorporated as one of the components in the adhesive layer of the UV protective tape reacts under the UV radiation to harden adjacent regions of the adhesive layer, thereby decreasing the adhesive properties of the UV protective tape, typically to a level of about 20 grams-force/cm$^2$ or less The protective tape portions 206', after being processed to reduce their adhesion, may be removed from the individual chips 204' by a protective tape removing apparatus, exemplary embodiments of which are described below.

Preferably, the thickness of the wafer 204 after regrinding is no more than about 200 µm and, in some instances, may be 50 µm or even less With substrates this thin, and particularly for larger chip areas, the invention provides both a method and mechanisms that can be used to separate the individual chips from the sawed wafer during a semiconductor packaging process while reducing the risk of damage caused to the chips.

Protective Tape Removal

Figure 11:
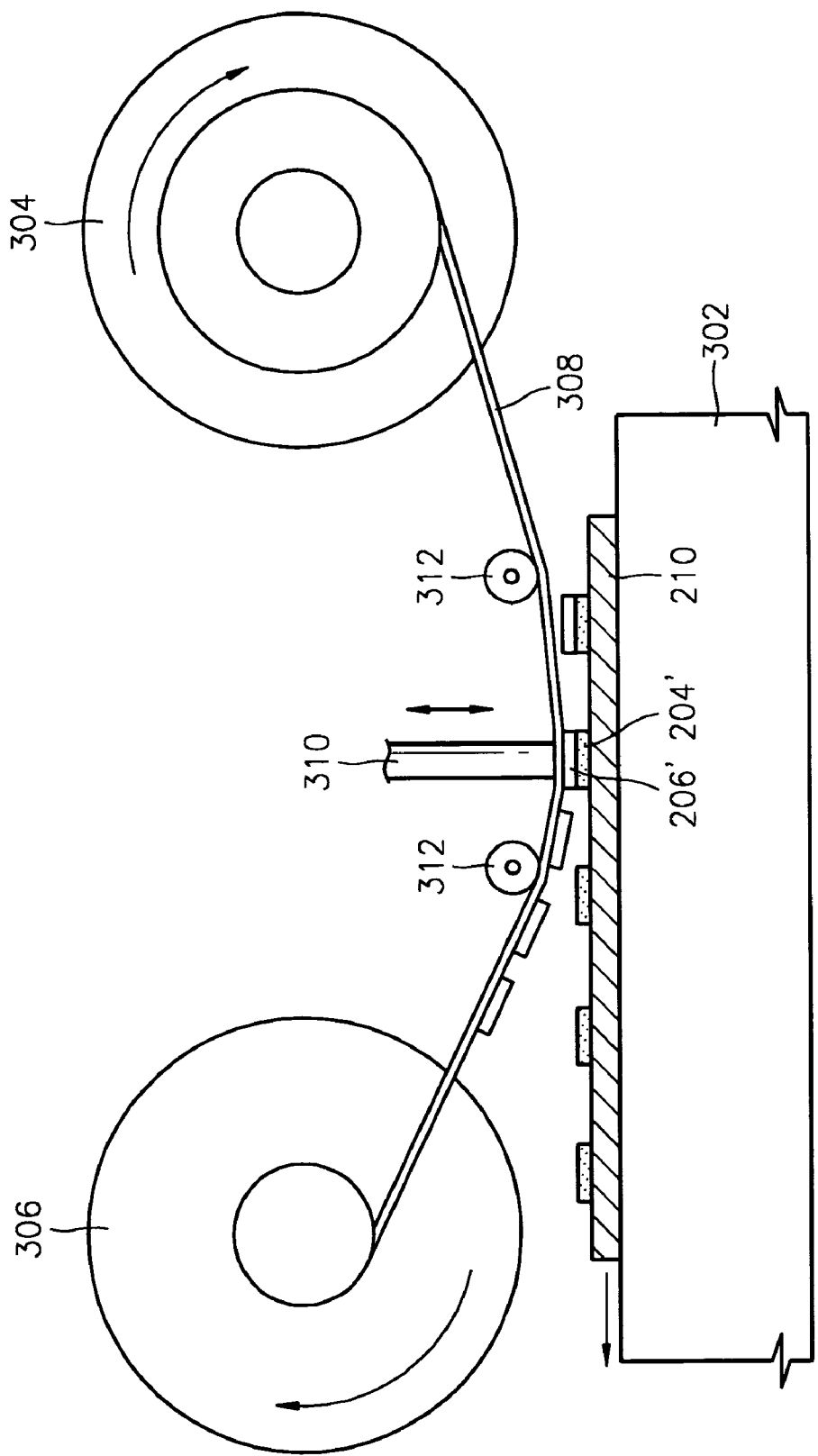
FIGS. 11 and 12 are cross-sectional views illustrating a protective tape removing apparatus according to an exemplary embodiment of the invention.
Figure 12:
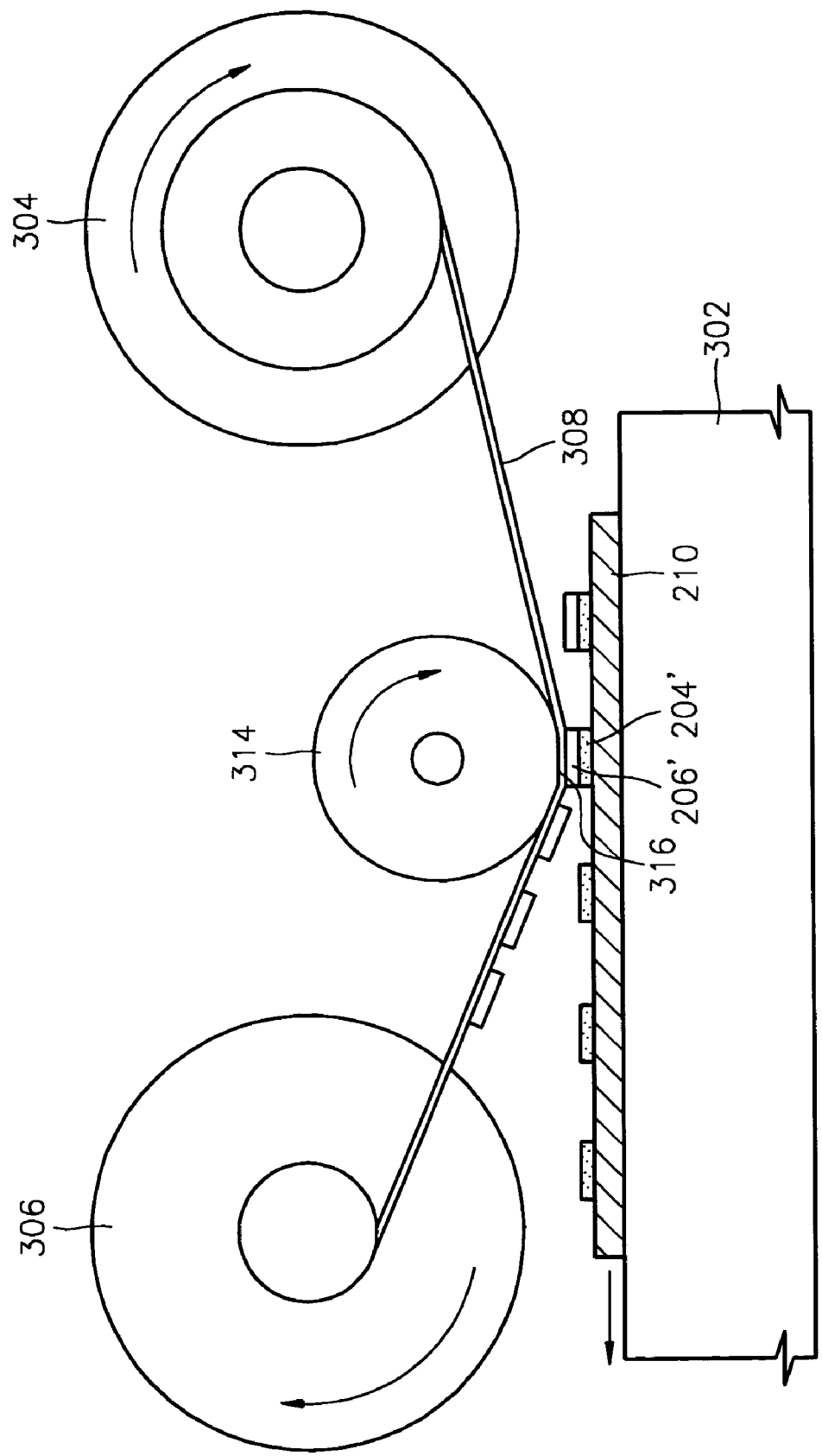

FIGS. 11 and 12 are cross-sectional views illustrating exemplary embodiments of a protective tape removing apparatus that may be utilized in practicing the invention. As illustrated in FIGS. 11 and 12, the protective tape removing apparatus includes a body 302 for accommodating the frame 210 on which the individual chips 204', with their the protective tape portions 206' still adhered, are attached, a release tape 308 which is arranged to be carried past the upper portion of the frame 210 and the upper surface of the protective tape portions 206', a pressure means for ensuring that the release tape 308 contacts and adheres to the protective tape portions 206', a supply roll 304 for supplying the release tape 308, a winding roll 306 for receiving and winding the release tape 308 and the adhered protective tape portions 206', and guide rollers 312 for maintaining the path and tension of the release tape 308 between the supply roll 304 and the winding roll 306.

The pressure means may be a pressure pin 310 that periodically extends, lowers or pivots to press the release tape 308 against the upper surface of the protective tape portions 206' or a pressure roller 314 having a smooth cylindrical pressure surface 316 arranged to press the release tape 308 against the upper surface of the protective tape portions 206' as the frame 210 and chip 204' pass under the pressure roller. The cross-sectional area of the pressure pin 310, the area of the pressure surface 316 and the applied pressure may be adjusted to correspond to the size and/or strength of the individual chips 204' or the protective tape portions 206'. The surface of the release tape 308 that will be pressed against the protective tape portions 206' is provided with an adhesive coating that will adhere firmly to the upper surface of the protective tape portions under the applied pressure.

An exemplary method of removing the protective tape portions 206' utilizing an apparatus as illustrated in FIG. 11 or 12 will now be described. The supply roll 304 supplies the release tape 308. The release tape 308 extends across a first guide roll or pin 312 and passes above the upper surface of the protective tape portions 206' arranged on the chips 204' attached to frames 210, across a second guide roll or pin 312 and is wound around the winding or take-up roll 306. When, as illustrated in FIG. 11, the pressure means is a pressure pin 310, the pressure pin 310 is arranged above the release tape 308 and periodically extends or moves downwardly to press the opposite surface of the release tape against the upper surface of the protective tape portions 206' and adhere the release tape firmly to the protective tape portion. As the pressure pin 310 is retracted or moved upwardly, the release tape also moves upwardly and away from the chip 204', thereby removing the adhered protective tape portion 206' from the surface of the chip. The release tape 308 is then advanced to present a clean adhesive surface to the next protective tape portion and wind the used portion of the release tape around the winding roll 306.

When, as illustrated in FIG. 12, the pressure means is a pressure roller 314, the release tape 308 typically passes beneath the rotating pressure roller 314 and is pressed against and adhered to the upper surface of the protective tape portions 206' passing below. As the release tape 308 emerges from beneath pressure roller 314, the release tape can move upwardly and away from chip 204' and thereby remove the adhered protective tape portions 206' from the surface of the chip. The above method is effective in a case where the plurality of chips 204' are formed on the frame 210. On occasion, the center of the rotation of the pressure roller 314 may be eccentric. The diameter and the rotation speed of the pressure roller 314 may be appropriately set as needed for the particular combination of frame, chip and protective tape to ensure good adhesion between the release tape and protective tape while reducing the risk of damage.

Although the method of removing the protective tape using the release tape was described in the present invention, it is not limited thereto and various changes in form and details may be made therein.

Figure 13:
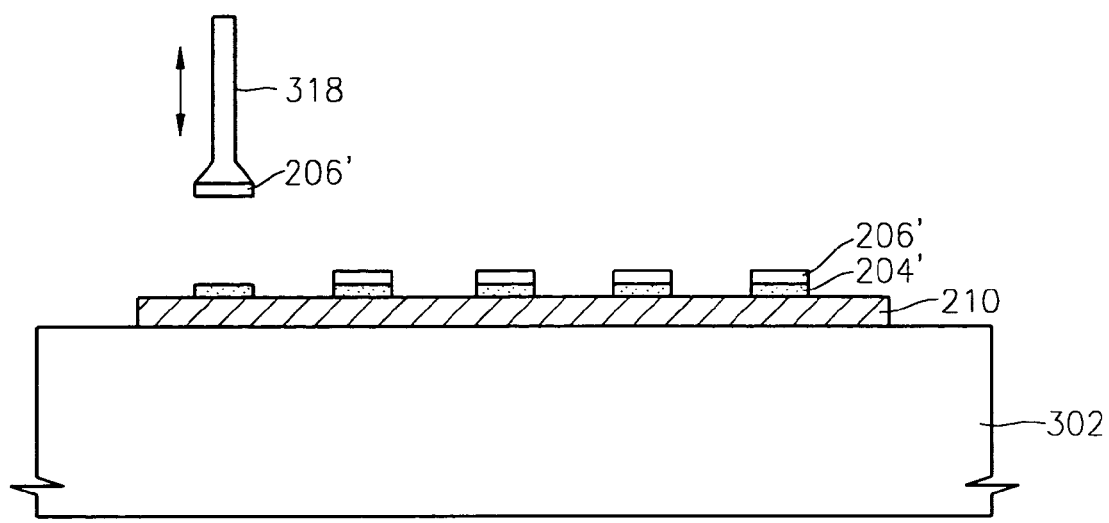
FIG. 13 is a cross-sectional view illustrating a protective tape removing apparatus according to an exemplary embodiment of the present invention.

Illustrated in FIG. 13 is a cross-sectional view of an exemplary embodiment of protective tape removing apparatus according to the invention that does not require the use of a release tape. As shown in FIG. 13, the protective tape removing apparatus includes a body 302 for loading the frame 210 on which the individual chips 204', and their corresponding protective tape portions 206', are mounted and a vacuum unit 318. The vacuum unit 318 may be positioned and extended to contact the upper surface of the protective tape portion 206' whose adhesion has decreased as a result of prior exposure to UV radiation or heat. Next, the vacuum unit 318 applies a vacuum to secure the protective tape portion 206' to the vacuum unit. The vacuum unit 318 is then retracted or raised to remove the protective tape portion 206' from the surface of the chip 204'. The protective tape portion 206' is then released by the vacuum unit 318, typically into a waste receptacle or other receiver, to clear the vacuum unit in preparation for the removal of the next protective tape portion. Depending on the frame, chip and tape removal apparatus, multiple vacuum units 318 may be incorporated and may be adapted for processing different chip sizes, the substantially simultaneous processing of multiple chips on a single frame or adjacent frames or simply increasing the process throughput.

As described above in connection with exemplary embodiments and methods, the invention allows a wafer, even thin wafers, to be divided into individual chips and transferred to a frame while reducing the likelihood of damage to the chips during the die attaching process without removing the protective tape provided on the chips.

While the present invention has been particularly shown and described with reference to certain exemplary embodiments, it will be understood by those of ordinary skill in the art that various changes in form and process sequence and details may be made without departing from the spirit and scope of the present invention as defined by the appended claims.

What is claimed is:

1. A method of assembling a semiconductor package, comprising:
    attaching a protective tape to the active surface of a semiconductor wafer characterized by an initial wafer thickness, the active surface containing a plurality of semiconductor chips separated by scribe lines;
    sawing the semiconductor wafer along the scribe lines to separate the plurality of semiconductor chips into individual chips, each individual chip being covered by a protective tape portions;
    attaching an individual chip to a chip pad;
    decreasing the adhesion between the individual chip and the corresponding protective tape portion; and
    removing the protective tape portion from the individual chip,
    wherein the individual chip is attached to the chip pad before the protective tape portion is removed.

2. The method of assembling a semiconductor package according to claim 1, further comprising:
    reducing the initial thickness of the semiconductor wafer to reach a final thickness after attaching the protective tape to the active surface.

3. The method of assembling a semiconductor package according to claim 2, wherein the final thickness of the semiconductor wafer is no greater than about 200 μm.

4. The method of assembling a semiconductor package according to claim 1, wherein the chip pad is provided on a leadframe, the leadframe also including outer leads, further comprising:
    forming the outer leads to provide external connections to the individual chip.

5. The method of assembling a semiconductor package according to claim 1, wherein the chip pad is provided on a substrate, the substrate also including solder balls to provide external connections to the individual chip.

6. The method of assembling a semiconductor package according to claim 1, wherein decreasing the adhesion of the protective tape further comprises:
    exposing the protective tape to UV radiation.

7. The method of assembling a semiconductor package according to claim 1, wherein decreasing the adhesion of the protective tape further comprises:

heating the protective tape to a temperature above a degradation temperature.

8. The method of assembling a semiconductor package according to claim 1, wherein the protective tape is substantially transparent to visible light.

9. The method of assembling a semiconductor package according to claim 1, wherein the protective tape has a thickness no greater than about 500 µm.

10. The method of assembling a semiconductor package according to claim 9, wherein the ratio of the final thickness of the semiconductor wafer and the thickness of the protective tape is between 1:1 and 1:10.

11. The method of assembling a semiconductor package according to claim 10, wherein the ratio is between 1:1 and 1:3.

12. The method of assembling a semiconductor package according to claim 1, wherein removing the protective tape portion further comprises:

extending a transfer device to contact a top surface of the protective tape portion;

applying a vacuum to a portion of the top surface of the protective tape portion to establish a temporary attachment between the protective tape portion and the transfer device; and retracting transfer device to separate the protective tape portion from the individual chip.

13. The method of assembling a semiconductor package according to claim 1, wherein removing the protective tape portion further comprises;

positioning a release tape adjacent a top surface of the protective tape portion, the release tape;

pressing an adhesive layer provided on the release tape against the top surface of the protective tape portion, causing the protective tape portion to adhere to the release tape; and increasing a separation distance between the release tape and the individual chip, thereby removing the protective tape portion from the surface of the individual chip.

14. An apparatus for use in assembling a semiconductor package comprising:

a chip positioning device for positioning an individual chip, the individual chip including a protected upper surface having a protective tape portion arrayed thereon;

a tape positioning device for positioning a release tape adjacent the protective tape portion;

a tape displacement device for causing the release tape to be attached to the protective tape portion and, once bonded, to separate the protective tape portion from the protected upper surface of the individual chip, while the individual chip is attached to a chip pad;

a tape supply device for dispensing the release tape; and a tape receiving device for receiving the release tape and the protective tape portion bonded thereto; and wherein the tape supply device includes a release tape supply roll;

the chip positioning device includes a conveyor or a holder;

the tape positioning device includes a guide roller or guide pin;

the tape displacement device includes a pressure roller or a pressure pin;

the tape receiving device includes a winding roll;

the chip positioning device is arranged and configured to hold a plurality of individual chips mounted on a carrier; and the carrier is a frame, a leadframe or a circuit board.

15. An apparatus for use in assembling a semiconductor package comprising:

chip positioning device for positioning an individual chip, the individual chip including a upper protected surface having a protective tape portion arrayed thereon;

tape removal device for removing the protective tape portion from the protected upper surface, while the individual chip is attached to a chip pad; and wherein the chip positioning device includes a conveyor or a holder;

the tape removal device includes a vacuum device arranged and configured to establish a secure, releasable attachment to an upper surface of the protective tape portion;

the chip positioning device is arranged and configured to hold a plurality of individual chips mounted on a carrier; and the carrier is a frame, a leadframe or a circuit board.

* * * * *